United States Patent
Chilek et al.

(10) Patent No.: US 9,307,672 B2
(45) Date of Patent: Apr. 5, 2016

(54) ACTIVE COOLING OF INSPECTION OR TESTING DEVICES

(71) Applicant: General Electric Company, Schenectady, NY (US)

(72) Inventors: Theodore Chilek, Skaneateles, NY (US); Nicholas Stancato, Syracuse, NY (US)

(73) Assignee: General Electric Company, Schenectady, NY (US)

( * ) Notice: Subject to any disclaimer, the term of this patent is extended or adjusted under 35 U.S.C. 154(b) by 269 days.

(21) Appl. No.: 13/975,500

(22) Filed: Aug. 26, 2013

(65) Prior Publication Data

US 2015/0055297 A1 Feb. 26, 2015

(51) Int. Cl.
*H05K 7/20* (2006.01)
*H01L 23/473* (2006.01)

(52) U.S. Cl.
CPC ........ *H05K 7/20154* (2013.01); *H05K 7/20136* (2013.01); *H05K 7/20436* (2013.01); *H05K 2007/20081* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 7,662,091 B2 | 2/2010 | Bagley et al. | |
| 7,758,495 B2 * | 7/2010 | Pease ................. | A61B 1/00052 600/104 |
| 7,872,864 B2 | 1/2011 | Mongia et al. | |
| 7,914,448 B2 | 3/2011 | Bob et al. | |
| 2004/0193016 A1 * | 9/2004 | Root .................... | A61B 1/0052 600/146 |
| 2005/0010084 A1 * | 1/2005 | Tsai ................... | A61B 1/00052 600/200 |
| 2005/0250983 A1 * | 11/2005 | Tremaglio ........... | A61B 1/0052 600/101 |
| 2006/0146127 A1 * | 7/2006 | Bagley ............... | G02B 23/2492 348/83 |

(Continued)

FOREIGN PATENT DOCUMENTS

| | | |
|---|---|---|
| EP | 1338236 | 8/2003 |
| EP | 1738679 | 3/2007 |

*Primary Examiner* — Anthony Haughton
*Assistant Examiner* — Razmeen Gafur
(74) *Attorney, Agent, or Firm* — Barclay Damon, LLP

(57) ABSTRACT

Modules, systems, and methods are provided for cooling components of an inspection or testing apparatus, such as a borescope. In some exemplary embodiments, the modules include two heat sinks, with the top-most heat sink having a fan assembly approximately centrally disposed therein. The fan assembly can be operated to draw air into the top-most heat sink, and then exhaust airflow out of the top-most heat sink such that the exhaust air passes across at least a portion of the second heat sink to help cool both the first and second heat sinks, and components of the apparatus associated therewith, using the same fan assembly. As a result, the components of the apparatus can be cooled more easily, and the performance and efficiency of these components is improved, all while reducing the overall size and weight of the inspection apparatus.

17 Claims, 6 Drawing Sheets

(56) References Cited

U.S. PATENT DOCUMENTS

| | | | |
|---|---|---|---|
| 2006/0281972 A1* | 12/2006 | Pease | A61B 1/00052 600/109 |
| 2007/0070340 A1* | 3/2007 | Karpen | A61B 1/00039 356/241.1 |
| 2007/0211431 A1* | 9/2007 | Munch | H01L 23/40 361/696 |
| 2008/0026647 A1* | 1/2008 | Boehnlein | G02B 23/2476 439/882 |
| 2008/0072673 A1* | 3/2008 | Carnevale | G01B 17/02 73/602 |
| 2009/0109283 A1* | 4/2009 | Scott | H05K 5/0017 348/65 |
| 2009/0109429 A1* | 4/2009 | Scott | G01N 21/88 356/237.1 |
| 2009/0167851 A1* | 7/2009 | Miller | G02B 23/2476 348/82 |
| 2009/0196459 A1* | 8/2009 | Watt | H04N 5/2251 382/103 |
| 2009/0225159 A1* | 9/2009 | Schneider | A61B 1/00124 348/82 |
| 2010/0033563 A1* | 2/2010 | Boehnlein | G01N 21/954 348/84 |
| 2010/0036321 A1* | 2/2010 | Hudson | A61B 1/00071 604/140 |
| 2011/0032675 A1* | 2/2011 | Lian | H01L 23/4006 361/697 |
| 2011/0090331 A1* | 4/2011 | Draper | G02B 23/2476 348/82 |
| 2011/0090493 A1* | 4/2011 | Schober | G01N 21/954 356/241.1 |
| 2011/0273556 A1* | 11/2011 | Lyons | G02B 23/2484 348/85 |
| 2011/0292608 A1* | 12/2011 | Tan | H01L 23/36 361/696 |
| 2013/0027527 A1* | 1/2013 | Scott | H04N 7/18 348/61 |
| 2013/0139112 A1* | 5/2013 | Domke | G06F 3/0482 715/841 |
| 2013/0317295 A1* | 11/2013 | Morse | A61B 1/00165 600/109 |

* cited by examiner

ACTIVE COOLING OF INSPECTION OR TESTING DEVICES

FIELD

The subject matter disclosed herein relates to cooling components of an electronic device, such as a video borescope.

BACKGROUND

Inspection or testing devices such as borescopes are generally used to inspect objects located remote from a device operator, such as internal components of gas and steam turbines. A tool having a video head disposed on its distal tip can be maneuvered by the operator to a desired viewing location, and a video signal from the video head provides a view of the desired location to the operator on a screen of the borescope. Motors and control systems to perform borescope functions such as maneuvering the tool and adjusting the image can be managed by one or more processors located on one or more circuit boards of the borescope. The operating components and the circuit boards, however, generate heat during use, which can negatively impact their performance and decrease their maximum operating temperature. The increased thermal energy of the components and circuit boards can cause them to become less reliable, less effective, and less efficient. Additionally, it can be difficult for an operator to handle the borescope, or at least specific components of the borescope, during and after use due to the amount of heat that builds up in certain operating components of the borescope.

Some borescopes include one or more heat sinks to help control the amount of thermal energy generated during use. Traditionally, these modules use passively cooled heat sinks that rely purely on natural convection for heat transfer. These heat sinks are often bulky and weigh a significant amount with respect to the whole borescope in order to provide sufficient surface area to maintain acceptable internal and external temperatures. Even then, current designs still result in borescopes that do not work efficiently and become too hot. Disadvantages related to efficiency, size, weight, and touch temperature affect the modules of borescopes that operate tools like articulable video heads. This can lead to the use of large heat sinks with long and/or tall fin arrays in order to provide sufficient surface area across which heat can be dissipated.

Accordingly, there remains a need for improved cooling, and thus performance and reliability, of the components of an electronic device, such as a borescope.

BRIEF DESCRIPTION

Modules, systems, and methods for cooling components of an electronic device, such as a borescope or endoscope, are generally disclosed herein. In general, a heat sink assembly is provided for cooling one or more components of an electronic device. The heat sink assembly can have a variety of configurations, and in one embodiment the assembly includes a first heat sink that is positioned adjacent to a second heat sink such that exhaust airflow from the first heat sink is directed through the second heat sink to thereby provide airflow through the second heat sink. Such a configuration can allow for the use of a single active cooling assembly adjacent the first heat sink without the need for an additional, independent active or passive cooling assembly adjacent the second heat sink.

In one embodiment, an inspection apparatus is provided and includes first and second housings. The first housing can have a user interface and a heat sink, and the second housing can be coupled to the first housing and can include a second heat sink that is located adjacent to the first heat sink, as well as a sensor. Additionally, the inspection apparatus can include a fan assembly that is located in one of the first and second housings. The fan assembly can be configured to provide airflow across both the first heat sink and the second heat sink.

In some embodiments, an elongate flexible insertion tool can extend from the second housing, and the tool can include the sensor. The sensor can be configured for use as at least one of an imaging device, an eddy current detector, an ultrasonic device, an x-ray device, and a temperature gauge. For example, the sensor can include a video imaging device on a distal tip of the tool. The video imaging device can be configured to produce a video signal that represents an image of a target within the device's viewing field, which can then be transmitted for viewing on the user interface of the first housing. The user interface can include at least one of a viewing screen, a digital read-out display, a scope or trace display, and an operational control unit, for instance to guide an elongate flexible insertion tool.

In another embodiment, a heat sink is provided and includes a fin array having first and second sides, with the first and second sides of the fin arrays being substantially vertically aligned. In some embodiments, a fan assembly can be located within a central portion of the heat sink. The fan assembly can be seated within an elastomeric holder that is disposed within the heat sink. Further, the fan assembly can include first and second fans.

In another embodiment, an inspection apparatus can include a first housing, a first heat sink, and a fan assembly. The first housing can have a distal portion with a user interface and a proximal handle portion, and it can also include a first circuit board. The device can also include a flexible elongate insertion shaft having a proximal end coupled to the first housing and a distal end having a sensor associated therewith. A first heat sink can be disposed within the distal portion of the first housing and can be in contact with the first circuit board. The heat sink can include a plurality of fins extending substantially parallel to one another, and the fins can have a central opening formed in a portion of the fins. The fan assembly can be seated within the central opening, and in one embodiment the fan assembly can include first and second fans that are configured to provide airflow across the first heat sink. The fan assembly can be seated within an elastomeric holder that is disposed within the first heat sink.

In some embodiments, the inspection apparatus can also include a second housing that is removably coupled to the first housing. The second housing can have a second heat sink coupled to a heat generating electronic component (such as a circuit board), and the fan assembly can be configured to provide airflow across both the first and second heat sinks. In some embodiments, the second housing can include an elongate flexible insertion tool that extends from the second housing. The tool can have a video imaging device on its distal tip, which can produce a video signal on the user interface that represents an image of a target within a viewing field of the tool.

The sensor can be configured for use as at least one of an imaging device, an eddy current detector, an ultrasonic device, an x-ray device, and a temperature gauge. The user interface can include at least one of a viewing screen, a digital read-out display, a scope or trace display, and an operational control unit, for instance to guide an elongate flexible insertion tool. In some embodiments, the sensor includes an imaging device located on a distal end of the flexible elongate insertion shaft. The imaging device can be configured to obtain an image of a target site.

In still another embodiment, an inspection apparatus can include a housing, an elongate insertion shaft, and first and second heat sink assemblies. The housing can have a user interface disposed on it. The elongate insertion shaft can extend distally from the housing and can have a sensor associated therewith. The imaging device can be configured for use as at least one of an imaging device, an eddy current detector, an ultrasonic detector, an x-ray device, and a temperature gauge to transmit data to the user interface. The first and second heat sink assemblies can be disposed within the housing and can be arranged such that an exhaust from the first heat sink assembly is distributed through the second heat sink assembly.

The housing can include first and second housing portions that are removably coupled to one another, with the first heat sink assembly being disposed within the first housing portion and the second heat sink assembly being disposed within the second housing portion. The user interface can include at least one of a viewing screen, a digital read-out display, a scope or trace display, and an operational control unit, for instance to guide an elongate flexible insertion tool. In some embodiments, the user interface includes a viewing screen and the sensor includes an imaging device located on a distal tip of the elongate shaft. The imaging device can be positioned adjacent to a target to be inspected and to obtain and transmit an image of the target to the viewing screen. The elongate insertion shaft can be removably coupled to the housing. The first heat sink assembly can include a fan assembly disposed in it. The fan assembly can circulate airflow from the first heat sink assembly to the second heat sink assembly. In some embodiments, a fan assembly can be disposed within a central portion of the first heat sink. The fan assembly can be seated within an elastomeric holder.

BRIEF DESCRIPTION OF THE DRAWING

These and other features will be more readily understood from the following detailed description taken in conjunction with the accompanying drawings, in which.

Figure 1:
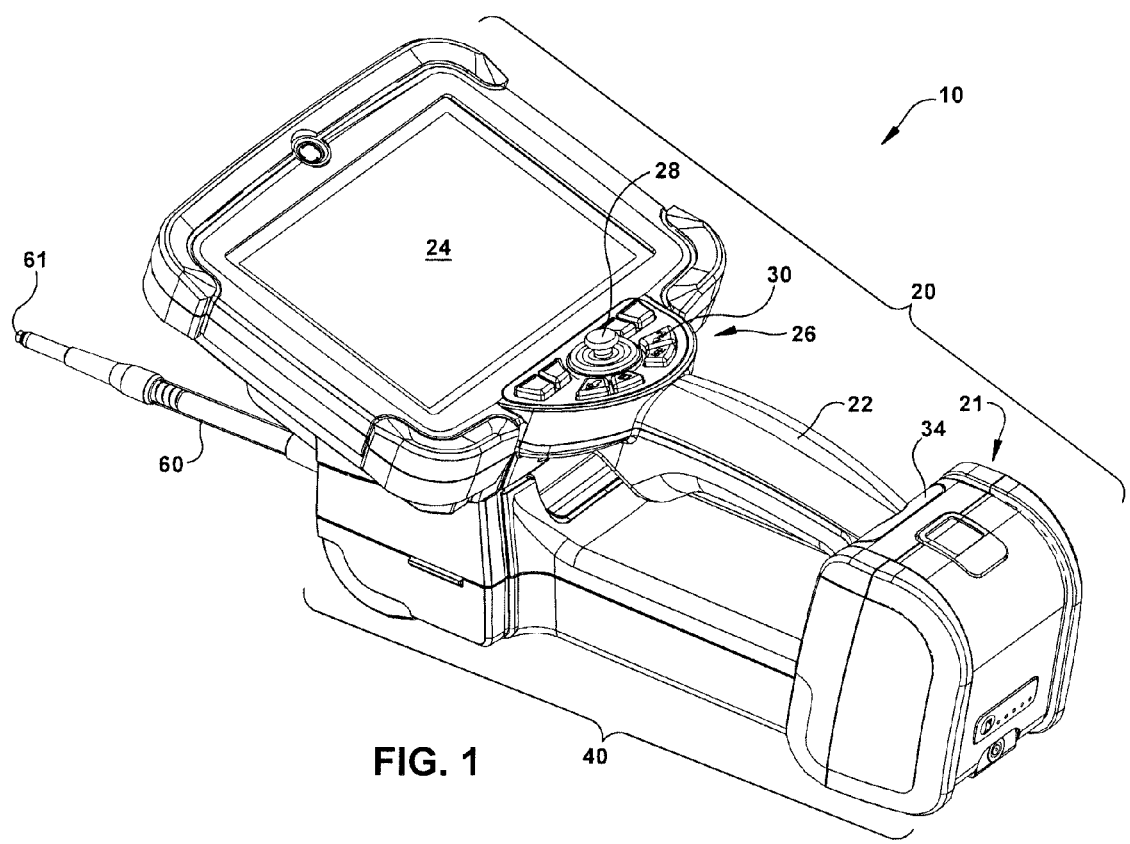
FIG. 1 is a perspective view of one exemplary embodiment of a borescope.

It is noted that the drawings are not necessarily to scale. The drawings are intended to depict only typical aspects of the subject matter disclosed herein, and therefore should not be considered as limiting the scope of the disclosure. In the drawings, like numbering represents like elements between the drawings.

DETAILED DESCRIPTION

Certain exemplary embodiments will now be described to provide an overall understanding of the principles of the structure, function, manufacture, and use of the modules, systems, and methods disclosed herein.

Modules, systems, and methods for cooling components of an electronic device are generally disclosed herein. In general, a heat sink assembly is provided for cooling one or more components of an electronic device. The heat sink assembly can have a variety of configurations, and in one embodiment the assembly includes a first heat sink that is positioned adjacent to a second heat sink such that exhaust airflow from the first heat sink is directed through the second heat sink to thereby provide airflow through the second heat sink. Such a configuration can allow for the use of a single active cooling assembly adjacent the first heat sink without the need for an additional, independent active or passive cooling assembly adjacent the second heat sink.

While the heat sink assembly can be utilized with a variety of electronic devices, in some instances the heat sink assembly can be used with inspection or testing devices, such as a portable or handheld borescope or an endoscope. A borescope or endoscope can have a handle assembly with a number of electronic components disposed therein for operating a tool configured to gather one or more video images and/or one or more still images of a target using a video imaging device and to transmit an image to a viewing screen on the handle assembly.

A person skilled in the art will appreciate that, while the heat sink assembly is primarily discussed in connection with a video borescope, the present invention can be used with a variety of electronic devices, such as other types of inspection or testing devices. Some non-limiting, exemplary inspection or testing devices include imaging devices, eddy current detectors, ultrasonic devices, x-ray devices, and temperature gauges. For purposes of description herein, the various types of inspection or testing devices with which the present disclosures can be used may generally be referred to as sensors. A sensor can transmit data representative of the parameter(s) it is configured to view, measure, and/or test to a user interface for display. Exemplary user interfaces can include viewing screens, digital read-out displays, and scope or trace displays, as well as operational control units to guide an elongate flexible insertion tool associated with the sensors.

Figure 2:
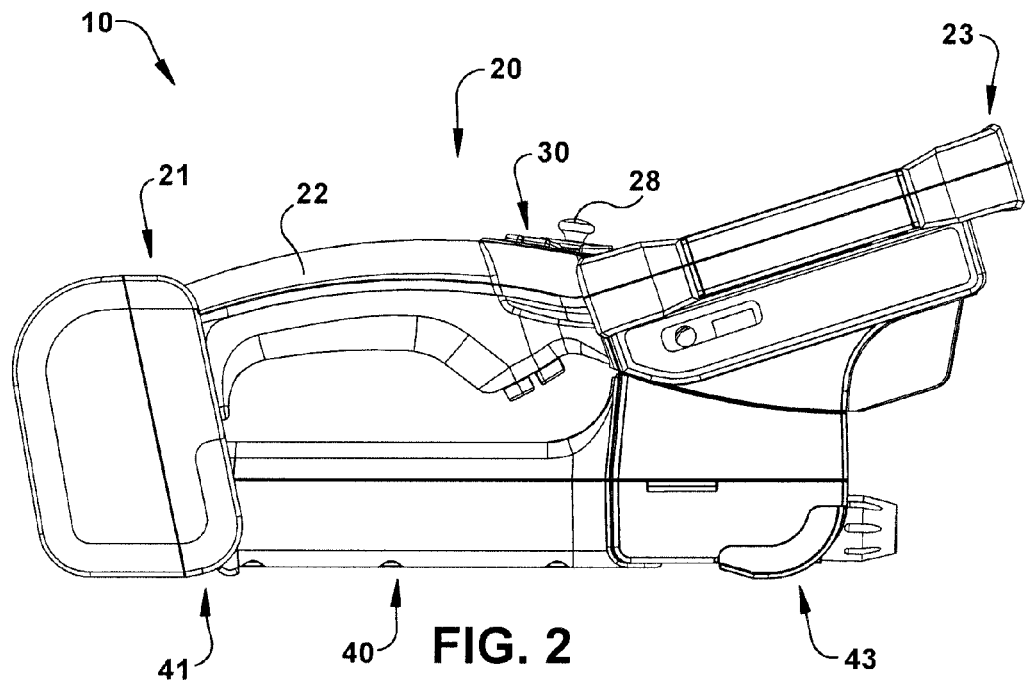
FIG. 2 is a side view of the borescope of FIG. 1 with a first housing of the borescope being attached to a second housing of the borescope at proximal portions thereof.
Figure 3:
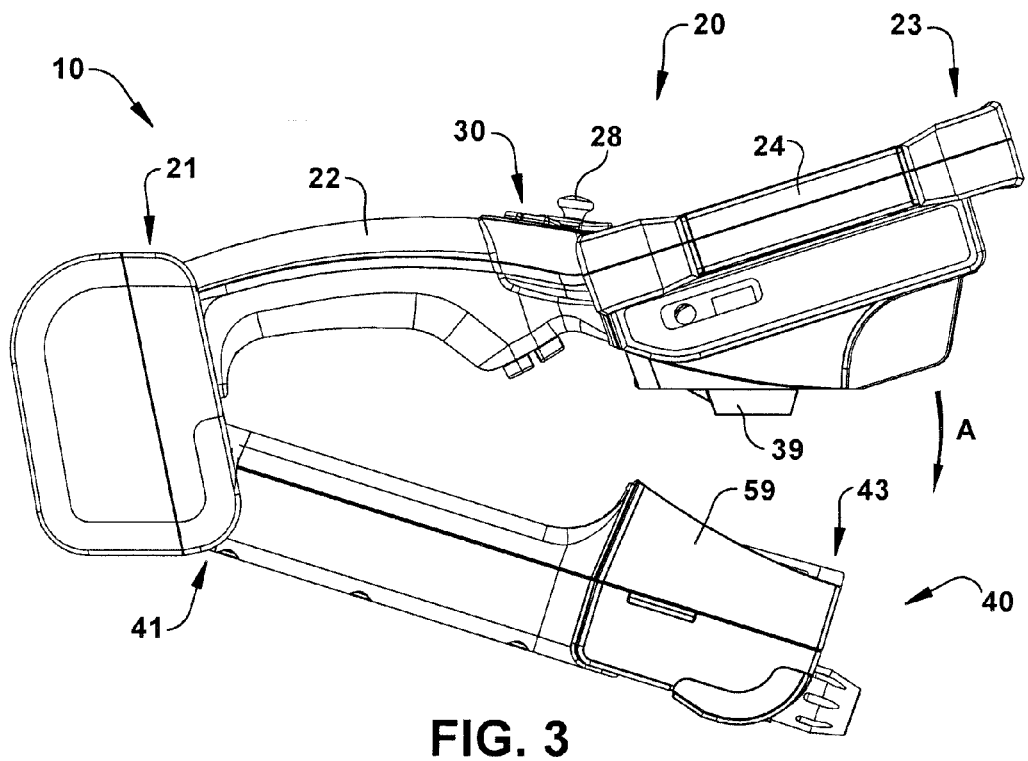
FIG. 3 is a side view of the borescope of FIG. 2 with the proximal portions of the first and second housings being detached.

FIGS. 1-3 illustrate one exemplary embodiment of a borescope 10 that includes two separate housing components or modules 20, 40 that are coupled together. The first module 20 generally includes a handle 22, a user interface, as shown a viewing screen 24, controls 26 for operating various features of the borescope 10, and one or more circuit boards (not shown) and/or other heat generating devices or components disposed therein. The second module 40 can be fixedly or removably coupled to the first module 20 and generally includes features for operating an elongate insertion tool 60 extending distally therefrom, such as one or more motors (not shown) to exert steering forces on a distal tip 61 of the tool 60 to provide articulation, and one or more circuit boards (not shown) to control the motor(s) and/or an LED assembly to illuminate the location at which the distal tip 61 is located.

The housings of each module 20, 40 can have a variety of shapes and sizes, which can depend, at least in part, on the components stored therein. In the illustrated embodiment, the first module 20 has a distal housing portion containing the viewing screen 24 and the controls 26. The handle 22 extends proximally from the distal housing portion for facilitating grasping of the device. A proximal end 21 of the handle 22 can be configured to couple to both a power source, such as a battery, as well as to a proximal end 41 of the second module 40. Techniques for mating to a power source and to the second module 40 will be discussed in detail below.

The viewing screen 24 on the first module 20 can be configured to display various operating parameters or other feedback related to various components of the borescope 10, as well as to display images of the target site obtained from the video imaging device. The controls 26 can be located proximal to the viewing screen 24 and can be used to manipulate the video imaging device as well as to manipulate information displayed on the viewing screen. In the illustrated embodiment, the controls 26 include a joystick 28 for guiding a video imaging device, and a keypad 30 for providing different commands to an imaging device, screen, and/or other components of the borescope 10. The viewing screen 24 and controls 26 can more generally be referred to as components of a user interface, which can include one or both of the viewing screen and controls. A person skilled in the art will recognize other features of a user interface that can exist in a video borescope, or more generally an inspection or testing apparatus. Some non-limiting examples of other components of a user interface include a digital read-out display and a scope or trace display. The components incorporated therein will depend, at least in part, on the inspection or testing for which the apparatus is configured to be used.

Figure 9:
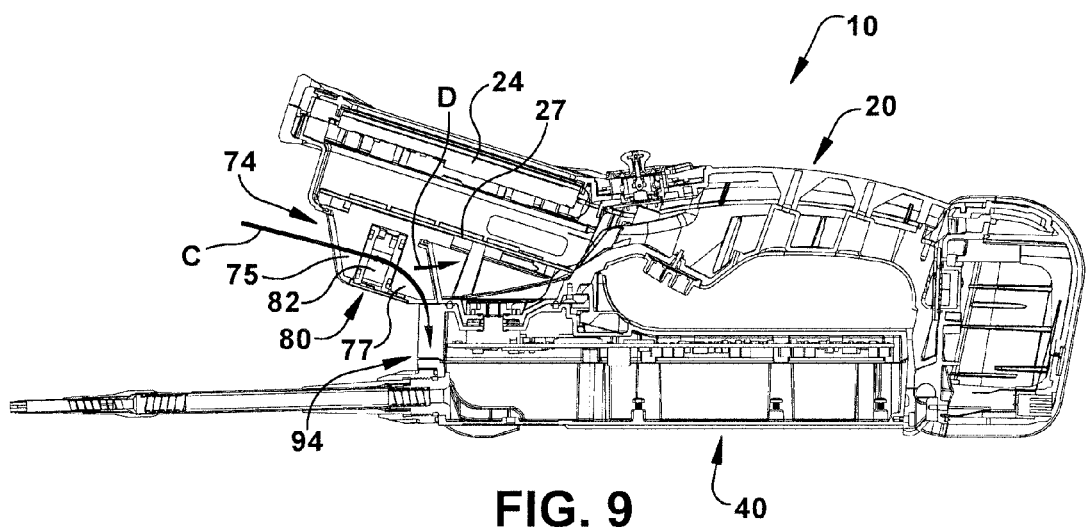
FIG. 9 is a side cross-sectional view of the borescope of FIG. 1.
Figure 10:
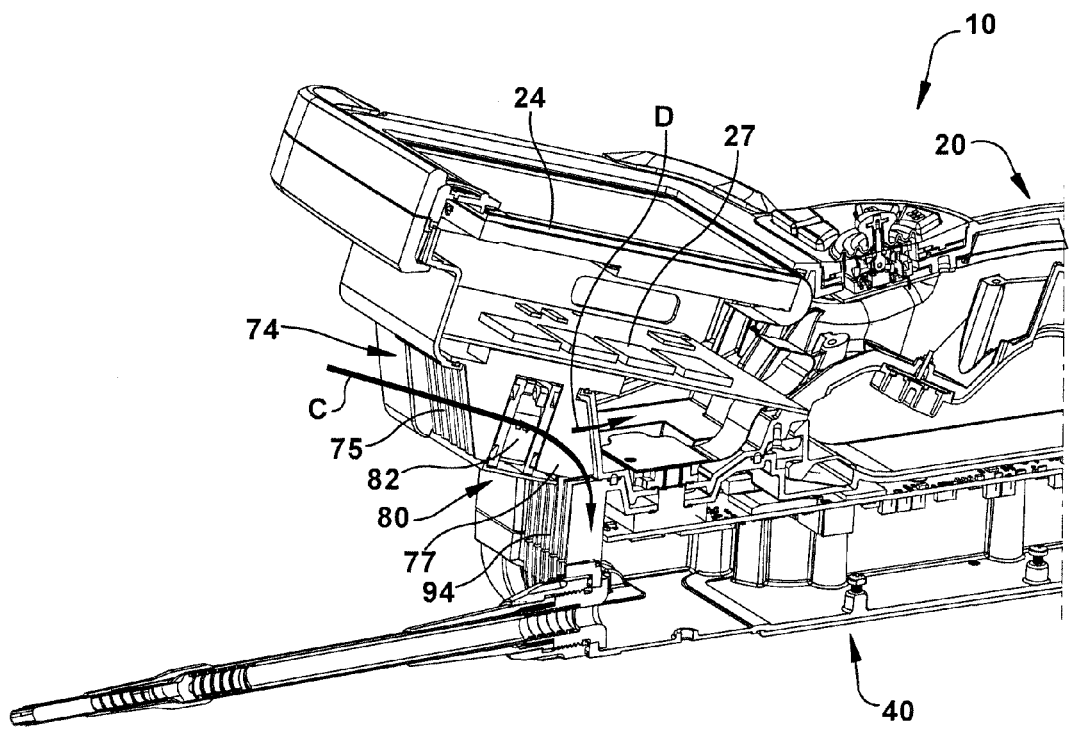
FIG. 10 is a perspective cross-sectional view of the borescope of FIG. 9.

One or more circuit boards and related electronic components, such as processors, can be located anywhere in the borescope 10, but in one exemplary embodiment at least a portion of at least one circuit board 27 is disposed beneath the viewing screen 24, as shown in FIGS. 9 and 10. The circuit board(s) and related electronic components can include a single chip computer, central processing unit, or equivalent capable of operating one or more of the electronic components of the borescope. For example, in the illustrated embodiment, one circuit board can include two main processing chips and can help control the display 24 and the controls 26. The circuit board can also include, by way of non-limiting example, memory components and other energy or heat sources known to those skilled in the art. In one exemplary embodiment, at least one of the circuit boards is a single board computer, commonly referred to as an SBC. To the extent the circuit board(s) are cooled in accordance with the disclosures herein, components such as the processors can be cooled to improve their performance, efficiency, and reliability.

The second module 40 can also have a variety of configurations. In the illustrated embodiment, the second module 40 has a generally elongate shape with a proximal end 41 that is coupled to the first module 20 and a distal end 43 having the elongate insertion tool 60 extending distally therefrom. While a person skilled in the art will recognize any number of instruments or tools can be used in connection with the borescope, in one exemplary embodiment the tool is generally elongate and flexible and includes a video imaging device, such as a camera, on its distal tip 61. The video imaging device can be configured to produce a video signal that is representative of a target image within a viewing field of the video imaging device. The signal can be reproduced on the viewing screen 24 of the first module 20 to illustrate to the user the target image. The tools can have different sizes. For example, video imaging devices having diameters of about 4 millimeters, about 5 millimeters, about 6 millimeters, about 7 millimeters, and about 8 millimeters can be used in conjunction with the second module 40.

As indicated above, the second module 40 can be removably mated to the first module 20. While various mating techniques can be used, in one embodiment, a pivot rod 36 (shown in FIG. 6) is coupled to a mounting plate 34 on the first module 20 (or directly to the housing of the first module 20) and the pivot rod 36 is configured to receive the second module 40 on outside ends thereof. As a result, the first and second modules 20, 40 can be pivotally mounted with respect to each other, as shown in FIGS. 2 and 3, with the pivot rod 36 serving as a pivot around which at least one of the modules 20, 40 rotates. The borescope 10 can thus move between an attached configuration, shown in FIG. 2, in which a proximal end 41 of the second module 40 is coupled to the proximal end 21 of the first module 20, and a detached configuration, shown in FIG. 3, in which the proximal ends 21, 41 of the first and second modules 20, 40 are detached while the second module 40 pivots away from the first module 20 in a direction A. The proximal ends 21, 41 of the first and second modules 20, 40 can include complementary mating features 39, 59 for purposes of mating in the attached configuration, as shown in FIG. 3. A person skilled in the art will appreciate that the first module 20 can be used interchangeably with a variety of second modules having different configurations and different sizes and tools associated therewith.

Figure 4:
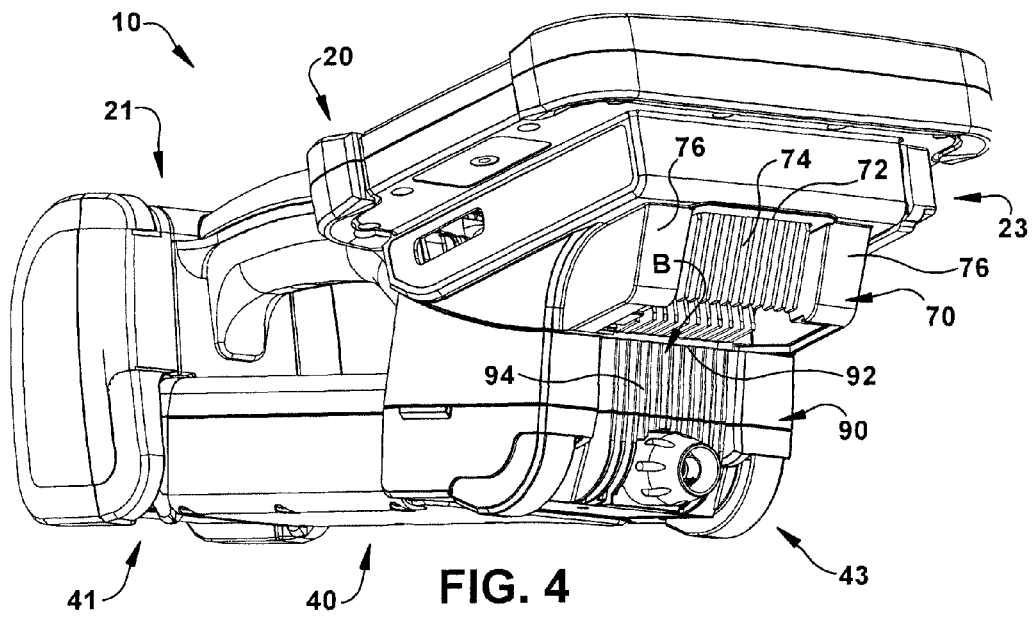
FIG. 4 is a side perspective view of the borescope of FIG. 2.
Figure 5:
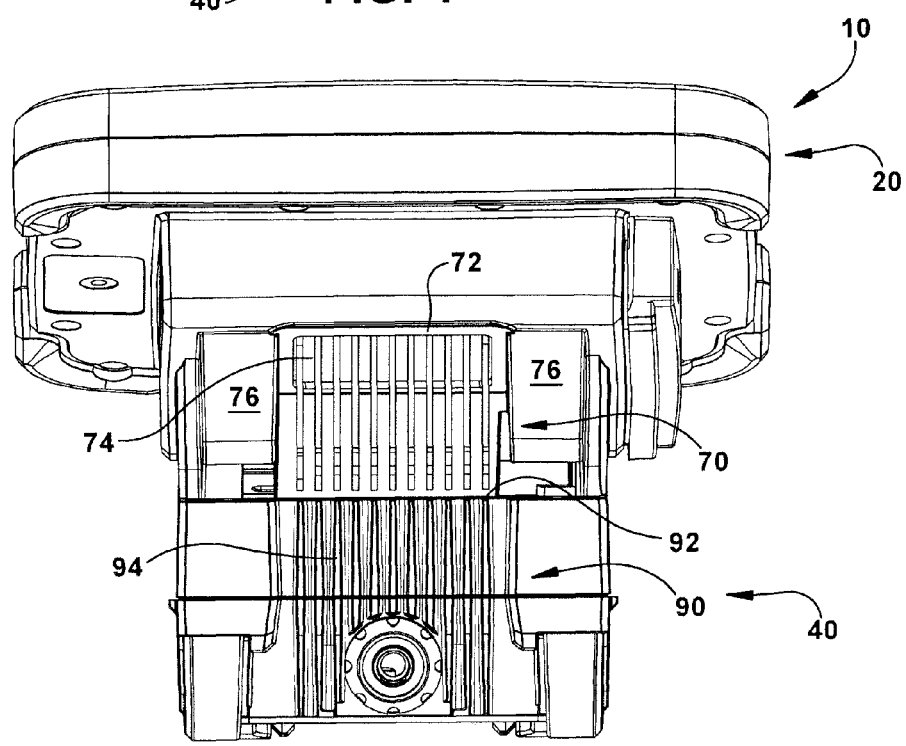
FIG. 5 is a front perspective view of the borescope of FIG. 4.

A heat sink assembly is provided having a first heat sink that is adjacent to a second heat sink to allow an airflow exhaust from the first heat sink to be directed through the second heat sink. Such a configuration allows a single cooling assembly, such as a fan assembly, to be used for both heat sinks. FIGS. 4 and 5 illustrate one exemplary embodiment of such a heat sink assembly. As shown, the first module 20 includes a first heat sink 70 at a distal end 23 thereof, and the second module 40 includes a second heat sink 90 at a distal end 43 thereof and positioned immediately adjacent to and in alignment with the first heat sink 70. In some embodiments, like the one illustrated, the distal-most end of the first heat sink 70 can be more distal than the distal-most end of the second heat sink 90.

While the heat sinks 70, 90 can have various configurations, in the illustrated embodiment, both heat sinks 70, 90 include a base 72, 92 and an array of parallel fins 74, 94 coupled to the base 72, 92. The fins 74 of the first heat sink 70 can be vertically aligned with the fins 94 of the second heat sink 90 to promote airflow from one heat sink to the other, as described in greater detail below. Additionally, stanchions 76 can be formed on either side of the first heat sink 70 to create an air funnel that directs airflow from the first heat sink 70 to the second heat sink 90, as shown by the arrow B in FIGS. 4, 9, and 10. The shape of the floor section of the housing of the first module 20 can be such that it vertically channels or funnels the airflow down to the second heat sink 90. Airflow hitting the funnel floor section of the housing of the first module 20 also directly cools the first module housing and/or the components therein.

The heat sinks 70, 90 provide a direct conduction path between electronic components of the borescope to be cooled (e.g., circuit boards, video screen 24, motors, and LED light) and a surrounding, cooler medium (e.g., air). By conducting heat across the portions of the heat sinks 70, 90, the performance and reliability of electronic components associated therewith can be improved. The fins 74, 94 of the heat sinks 70, 90 provide additional surface area across which thermal energy can be dissipated. In some embodiments, the first heat sink 70 can be mounted such that it is in direct contact with the circuit board(s) of the first module 20, and the second heat sink 90 can be mounted such that it is in direct contact with a circuit board of the second module 40, and/or other heat generating components thereof. In other embodiments, a thermal interface component configured to transfer thermal energy can be disposed between the respective heat sink and circuit board and/or other heat generating components.

As shown in FIGS. 4 and 5, the second heat sink 90 can be disposed adjacent to and below the first heat sink 70. The location of the second heat sink 90 can be such that it optimally receives the airflow from the first heat sink 70 to help transfer thermal energy from the second heat sink 90 to the surrounding air. As shown, the optimal configuration is established by having the fins 94 of the second heat sink 90 be substantially vertically aligned with respect to the fins 74 of the first heat sink 70. In other embodiments, the fins 94 of the second heat sink 90 can be staggered with respect to the fins 74 of the first heat sink 70 such that the fins 74 are substantially vertically aligned with spaces between the fins 94 of the second heat sink 90.

The size, shape, number of fins, space between the fins, and materials used to make the heat sinks 70, 90 can depend, at least in part, on the other components of the borescope, and the desired amount of cooling. Generally the desired conductivity of the heat sinks 70, 90 is in the range of about 50 Watts per meter per Kelvin to about 500 Watts per meter per Kelvin. Exemplary materials for use in making either or both of the first and second heat sinks 70, 90 can include, by way of non-limiting example, aluminum, copper, graphite, magnesium, and compositions or composites thereof. In some embodiments, both heat sinks can be made of the same material having the same approximate conductivity, while in other embodiments the first heat sink 70 can have a higher conductivity than the second heat sink 90. In one exemplary embodiment, the first heat sink 70 is made of aluminum and has a conductivity of about 150 Watts per meter per Kelvin, while the second heat sink 90 is made of magnesium and has a conductivity of about 72 Watts per meter per Kelvin. Additionally, any number of techniques known to those skilled in the art can be used to locate the heat sinks 70, 90 within the first and second modules 20, 40, respectively. In the illustrated embodiments, the heat sinks 70, 90 are integrally formed in the housings of the first and second modules 20, 40, respectively.

Figure 6:
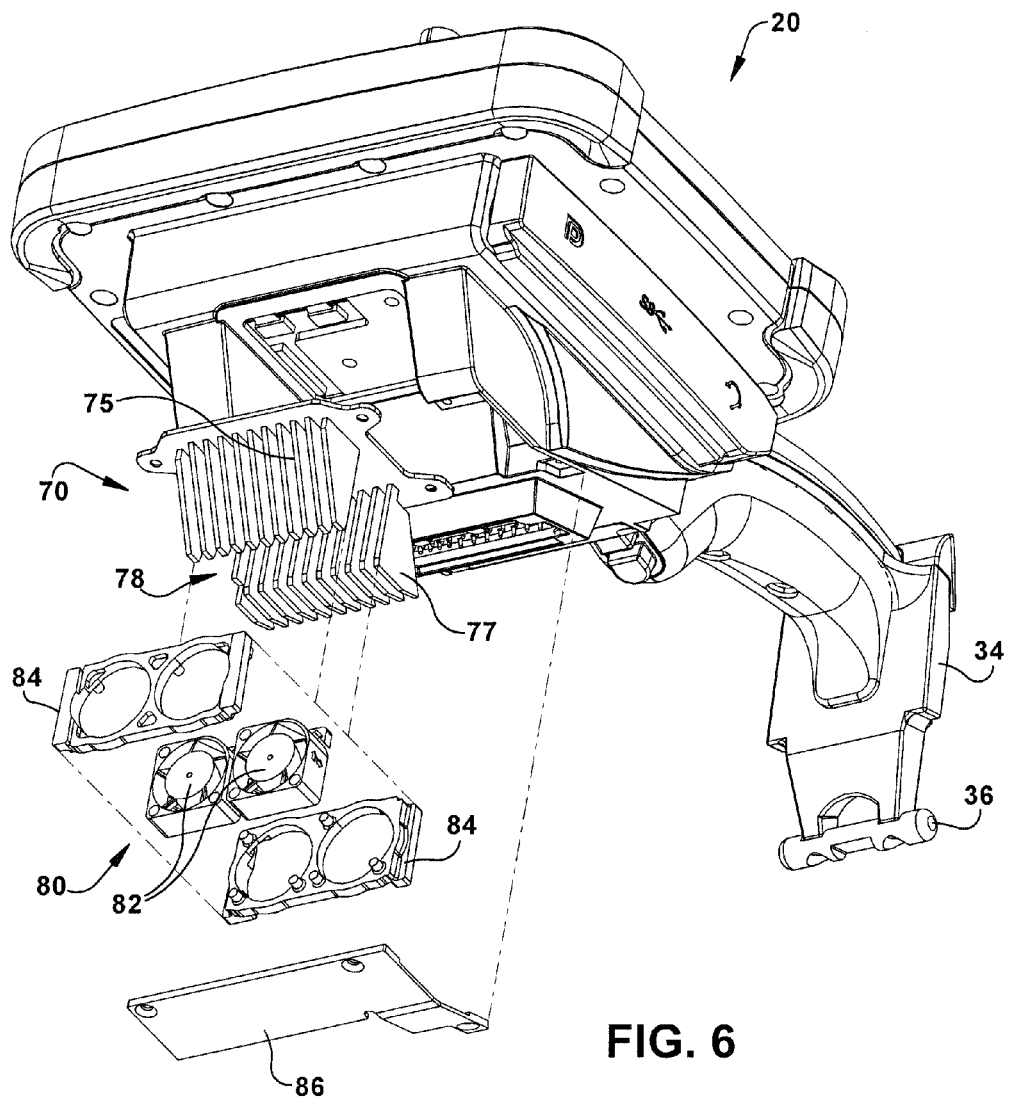
FIG. 6 is a partially exploded view of the first housing of the borescope of FIG. 2, illustrating components of a heat sink and fan assembly.
Figure 7:
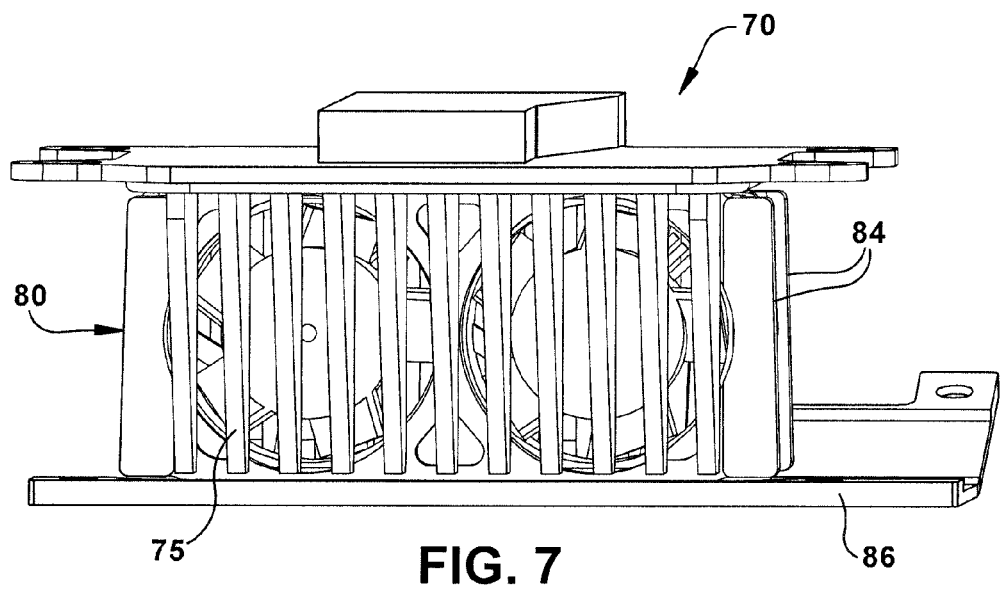
FIG. 7 is a front perspective view of the heat sink and fan assembly of FIG. 6.
Figure 8:
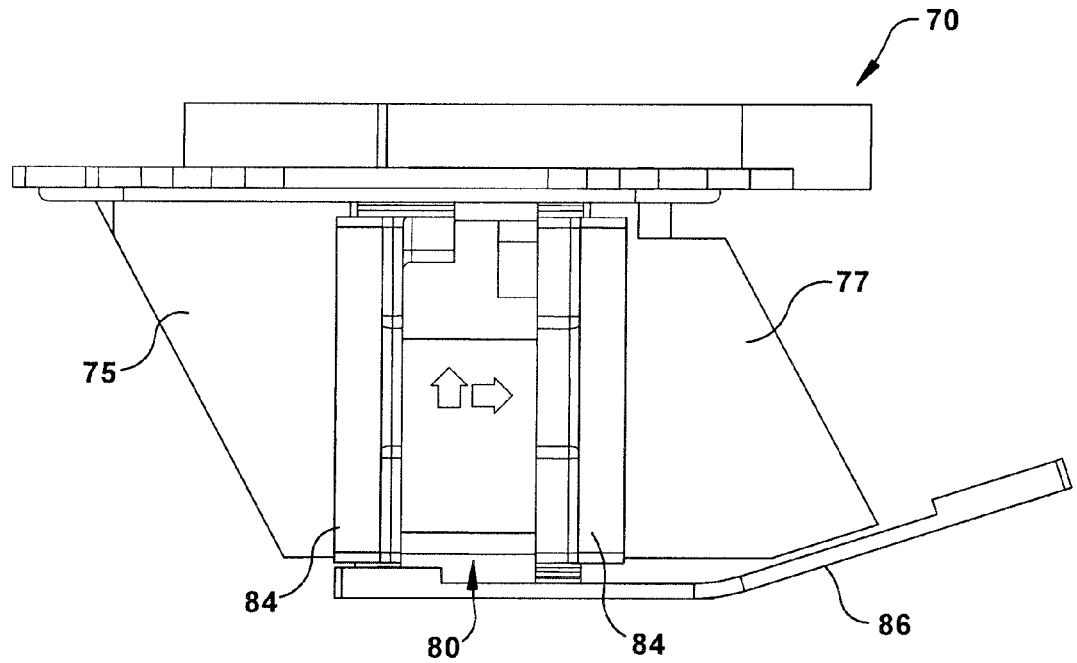
FIG. 8 is side view of the heat sink and fan assembly of FIG. 7.

As shown in FIGS. 6-8, the first heat sink 70 can further include a central opening 78 formed therein. The central opening 78 can divide the first heat sink 70 into a distal portion 75 of fins and a proximal portion 77 of fins, and the central opening 78 can be configured to receive a fan assembly 80 therein. While the shape of the resulting portions 75, 77 of the fin array can vary, in the illustrated embodiment, the distal portion 75 has a substantially triangular shape, with a base of the substantially triangular shape being closer to the viewing screen 24 than a vertex of the substantially triangular shape, and the proximal portion 77 has a substantially triangular shape, with a vertex thereof being closer to the viewing screen 24 than a base of the substantially triangular shape.

The fan assembly 80 disposed in the central opening 78 of the first heat sink 70 is configured to draw air from an ambient environment external to the heat sink 70 through the distal portion 75 and to expel heated air out of the heat sink 70 approximately through the proximal portion 77 to help move air across the heat sink 70 and out of the borescope 10. In one exemplary embodiment, air is drawn in at the distal-most portion of the fins 74 (e.g., at an air inlet), and the air exhausts at a portion of the fins 74 that extends downward (e.g., at an air outlet), towards the second heat sink 90. Air can also exhaust out of the first heat sink 70 at a proximal-most end, into the first module 20, to provide direct cooling of components disposed therein. The fan assembly 80 can have a variety of configurations, but in the illustrated embodiment, it includes a pair of axial fans 82 that extend across the length of the fin array 74. As shown, the axial fans 82 can be mounted into the central opening 78 using a pair of elastomeric holders or shock mounts 84 disposed on opposite sides of the fans 82. Additionally, a cover plate 86 can be located below the fans 82, and the holders 84 and/or the fans 82 can be coupled to the cover plate 86. Although not shown, in other embodiments, a fan assembly can be included at any location in the second heat sink 90, including in a central opening if such an opening is formed.

A speed of the fans 82 can be controlled to further optimize the cooling and power consumption of the borescope 10. In one exemplary embodiment, fan speed can be controlled based on various real-time temperature readings made at various locations of the first and second modules 20, 40. One or more temperature sensors (not shown) can be provided at one or more locations in the first and second modules 20, 40, and then the borescope 10 can be programmed to change the speed of the fans 82 to achieve a desired temperature at the particular location(s). As a result, the fan speed can be lowered when a desired temperature at one or more locations is achieved, which in turn allows power to be conserved and battery life to be extended. Accordingly, in instances in which the ambient environmental temperature is lower, or in instances in which less heat is being generated by the circuit board(s) and other electronic components of the borescope, the fan speed can be reduced and power conserved.

In use, a borescope 10 can be operated using many of the same techniques known to those skilled in the art, which can include using the controls and associated motors to articulate and maneuver the borescope 10 to a desired viewing location and then viewing that area from the display 24 based on a signal transmitted from a viewing device at the distal tip 61 of the tool 60. As the borescope 10 continues to be used, the electronic components disposed therein can generate heat, and if not properly cooled, can operate less efficiently, less accurately, less reliably, and/or lower the maximum operating temperature of the borescope.

As the components of the borescope 10 generate heat during use, the thermal energy from the components can be managed by conducting thermal energy from the components to the heat sinks 70, 90 and then from the heat sinks 70, 90 to a surrounding environment, such as air. The transfer of energy from the components to the heat sinks 70, 90 can occur, for instance, by a direct connection therebetween, or across one or more thermal interface components disposed therebetween. As the thermal energy moves from the components to the heat sinks 70, 90, the components are cooled so additional thermal energy can be accepted. Likewise, as the thermal energy moves from the heat sinks 70, 90 to the outside environment, the heat sinks 70, 90 are cooled so additional thermal energy can be accepted. Generally, as the heat sinks 70, 90 are warming up, the amount of thermal energy being transitioned across the heat sinks 70, 90 exceeds the amount of thermal energy dissipating into the surrounding environment. A person skilled in the art will recognize that during steady state operation, the amount of heat entering and transitioning across the heat sinks 70, 90 is approximately equal to the amount of heat being dissipated into the surrounding environment, while when cooling, the amount of heat entering the heat sinks 70, 90 is lower than that being dissipated. Operation of the fan assembly 80, however, can help improve the amount and speed at which thermal energy is transferred from the heat sinks 70, 90 to the outside environment.

As shown in FIGS. 9 and 10, air can be drawn into the first fin array 74 by the fan assembly 80 and then exhausted into the second fin array 94, as illustrated by arrow C. More particularly, the fans 82 of the fan assembly 80 can rotate to draw air into the first fin array 74 through a distal portion 75 of the array 74. The air is then drawn towards the fans 82 before being blown out of the fans 82 as exhaust. Exhaust can be blown out a proximal end of the proximal portion 77 of the fins 74, i.e., towards the circuit board(s) and other components of the first heat sink 70, as illustrated by an arrow D. In an exemplary embodiment, as illustrated by the arrow C, exhaust is blown out a bottom portion of the proximal portion 77 of the first fin array 74, and across the top and/or front of the second fin array 94 of the second heat sink 90. After passing through at least a portion of the second fin array 94, the air can be exhausted out of the borescope 10 to an outside environment.

The particular configurations described herein permit a single fan assembly disposed centrally in one heat sink to help cool components associated with two separate modules: the first, handset module 20 and the second, insertion instrument module 40. The increased airflow across the heat sinks 70, 90 of the two modules 20, 40 results in a higher convective heat transfer coefficient, thereby resulting in more efficient heat transfer and lower temperatures of the modules 20, 40. A person skilled in the art will recognize that a higher convective heat transfer coefficient leads to improved performance of the operating components of the borescope 10 associated with the first and second modules 20, 40 that would otherwise become hotter, less efficient, and less accurate during use. More particularly, because of the arrangement disclosed herein, exhaust air that would typically go from the first heat sink 70 to an outside environment instead is used to help cool the second module 40, and components thereof.

Aside from the improved performance of the components of the first and second modules 20, 40 of the borescope 10, the disclosed modules, systems, and methods can decrease the size, and thus the weight, of the heat sinks 70, 90 associated therewith, particularly for the second heat sink 90 since it would otherwise not be cooled without adding a second set of fans. Additionally, the borescope 10 can be more easily handled by the operator because it is cooler and lighter weight. Those skilled in the art sometimes refer to this as an improved touch temperature.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An inspection apparatus, comprising:
   a first housing having a user interface and a first heat sink;
   a second housing coupled to the first housing, the second housing having a sensor associated therewith and a second heat sink that is located adjacent to the first heat sink;
   a fan assembly located in one of the first and second housings and configured to provide airflow across both the first heat sink and the second heat sink; and
   a first stanchion located on a first side of the first heat sink and a second stanchion located on a second opposite side of the first heat sink, the first and second stanchions being configured to form an air funnel for directing airflow from the first heat sink toward the second heat sink.

2. The inspection apparatus of claim 1, wherein the first and second heat sinks each comprise a fin array having first and second sides, and wherein the first and second sides of the first and second heat sinks are substantially vertically aligned.

3. The inspection apparatus of claim 1, wherein the fan assembly is located within a central portion of the first heat sink of the first housing.

4. The inspection apparatus of claim 1, wherein the fan assembly is seated within an elastomeric holder that is disposed within the first heat sink.

5. The inspection apparatus of claim 1, wherein the fan assembly includes first and second fans.

6. The inspection apparatus of claim 1, wherein the first housing includes a distal portion having the user interface disposed thereon and a proximal handle portion, and wherein the second housing is removably coupled to the proximal handle portion of the first housing.

7. The inspection apparatus of claim 1, wherein the first heat sink is located within the distal portion of the first housing.

8. The inspection apparatus of claim 1, wherein the sensor is configured for use as at least one of an imaging device, an eddy current detector, an ultrasonic device, an x-ray device, and a temperature gauge.

9. An inspection apparatus, comprising: a first housing having a distal portion with a user interface and a proximal handle portion, the first housing including a first circuit board; a flexible elongate insertion shaft having a proximal end coupled to the first housing and a distal end having a sensor associated therewith; a first heat sink disposed with the distal portion of the first housing and in contact with the first circuit board, the first heat sink including a plurality of fins extending substantially parallel to one another, the fins having a central opening formed in a portion thereof; a second housing removably coupled to the first housing and having a second heat sink coupled to a heat generating electronic component; and a fan assembly seated within the central opening of the fins of the first heat sink and configured to provide airflow across both the first heat sink and the second heat sink; and a first stanchion located on a first side of the first heat sink and a second stanchion located on a second opposite side of the first heat sink, the first and second stanchions being configured to form an air funnel for directing airflow from the first heat sink toward the second heat sink.

10. The inspection apparatus of claim 9, wherein the fan assembly includes first and second fans configured to provide airflow across the first heat sink.

11. The inspection apparatus of claim 9, wherein the sensor is configured for use as at least one of an imaging device, an eddy current detector, an ultrasonic device, an x-ray device, and a temperature gauge.

12. The inspection apparatus of claim 9, wherein the user interface comprises at least one of a viewing screen, a digital read-out display, a scope display, and an operational control unit.

13. An inspection apparatus, comprising: a housing having a user interface disposed thereon; an elongate insertion shaft extending distally from the housing and having a sensor associated therewith, the sensor being configured for use as at least one of an imaging device, an eddy current detector, an ultrasonic detector, an x-ray device, and a temperature gauge to transmit data to the user interface; and first and second heat sink assemblies disposed within the housing and arranged such that an exhaust from the first heat sink assembly is distributed through the second heat sink assembly, wherein the housing includes first and second housing portions removably coupled to one another, and the first heat sink assembly is disposed within the first housing portion and the second heat sink assembly is disposed within the second housing portion; a first stanchion located on a first side of the first heat sink and a second stanchion located on a second opposite side of the first heat sink, the first and second stanchions being configured to form an air funnel for directing airflow from the first heat sink toward the second heat sink.

14. The inspection apparatus of claim 13, wherein the first heat sink assembly includes a fan assembly disposed therein for circulating airflow from the first heat sink assembly to the second heat sink assembly.

15. The inspection apparatus of claim 13, wherein the first heat sink assembly includes a fan assembly disposed within a central portion of the first heat sink.

16. The inspection apparatus of claim 13, wherein the user interface comprises at least one of a viewing screen, a digital read-out display, a scope display, and an operational control unit.

17. The inspection apparatus of claim 13, wherein the elongate insertion shaft is removably coupled to the housing.

\* \* \* \* \*